US 7,636,400 B2

(12) United States Patent
Thomson et al.

(10) Patent No.: US 7,636,400 B2
(45) Date of Patent: Dec. 22, 2009

(54) DECODING SYSTEM AND METHOD FOR DIGITAL COMMUNICATIONS

(75) Inventors: John S. Thomson, Santa Clara, CA (US); Paul J. Husted, Santa Clara, CA (US); Ardavan Maleki Tehrani, Santa Clara, CA (US); Jeffrey M. Gilbert, Santa Clara, CA (US); William J. McFarland, Santa Clara, CA (US); Lars E. Thon, Santa Clara, CA (US); Yi-Hsiu Wang, Santa Clara, CA (US)

(73) Assignee: Atheros Communications, Inc., Santa Clara, CA (US)

( * ) Notice: Subject to any disclaimer, the term of this patent is extended or adjusted under 35 U.S.C. 154(b) by 324 days.

(21) Appl. No.: 11/621,940

(22) Filed: Jan. 10, 2007

(65) Prior Publication Data

US 2007/0274407 A1    Nov. 29, 2007

Related U.S. Application Data

(60) Division of application No. 09/816,810, filed on Mar. 23, 2001, now Pat. No. 7,173,972, which is a continuation-in-part of application No. 09/535,902, filed on Mar. 24, 2000, now Pat. No. 6,507,619.

(60) Provisional application No. 60/271,615, filed on Feb. 26, 2001.

(51) Int. Cl.
*H04K 1/10* (2006.01)
*H04L 27/28* (2006.01)

(52) U.S. Cl. .................. 375/260; 375/340; 375/346; 714/792; 714/794; 714/795

(58) Field of Classification Search ............... 375/260, 375/340, 346, 262, 265, 232, 233; 714/792, 714/794, 795
See application file for complete search history.

(56) References Cited

U.S. PATENT DOCUMENTS 4,309,772 A    1/1982    Kloker et al.

(Continued)

FOREIGN PATENT DOCUMENTS

EP    0 700 189 A1    3/1996

(Continued)

OTHER PUBLICATIONS

Sari et al., "Frequency-domain equalization of mobile radio and terrestrial broadcast channels" (IEEE 0-783-1820-X/94, pp. 1-5).

*Primary Examiner*—Phuong Phu
(74) *Attorney, Agent, or Firm*—Bever, Hoffman & Harms, LLP; Jeanette S. Harms

(57) ABSTRACT

A Viterbi decoding system interprets bits in received QAM constellations as many-valued parameters rather than binary valued parameters. It performs the Viterbi algorithm using these many-valued parameters to provide results superior to hard decision decoding. Rather than applying a hard 0-1 function to the QAM data, the system uses a non-stepped linear or curved transfer function to assign values to the bits. In another aspect, a system differentiates between data bits based on their estimated reliability, giving more emphasis to decoding reliable bits than unreliable bits using any of a variety of techniques. By differentiating between god and bad bits and de-emphasizing or ignoring unreliable bits, the system can provide a significant reduction in uncorrectable errors and packet loss.

17 Claims, 12 Drawing Sheets

U.S. PATENT DOCUMENTS

| | | |
|---|---|---|
| 4,520,490 A | 5/1985 | Wei |
| 5,363,408 A | 11/1994 | Paik et al. |
| 5,812,613 A | 9/1998 | Zogg |
| 6,061,823 A | 5/2000 | Nara |
| 6,125,831 A | 10/2000 | Yasui et al. |
| 6,158,041 A | 12/2000 | Raleigh et al. |
| 6,269,129 B1 | 7/2001 | Rhee et al. |
| 6,317,470 B1 * | 11/2001 | Kroeger et al. ............... 375/340 |
| 6,353,637 B1 | 3/2002 | Mansour et al. |
| 6,442,130 B1 | 8/2002 | Jones, IV et al. |

FOREIGN PATENT DOCUMENTS

| | | |
|---|---|---|
| EP | 0 827 298 A2 | 3/1998 |
| EP | 0 827 300 A2 | 3/1998 |

\* cited by examiner

DECODING SYSTEM AND METHOD FOR DIGITAL COMMUNICATIONS

This is a divisional of U.S. application Ser. No. 09/816,810 which is a continuation in part of U.S. application Ser. No. 09/535,902. Priority is claimed based on said application Ser. Nos. 09/816,810 and 09/535,902, and based also on Provisional Application No. 60/271,615 filed Feb. 26, 2001.

BACKGROUND OF THE INVENTION

1. Field of the Invention

The present invention relates to digital communication systems. More particularly, the invention relates to decision decoding of received digital information for use in subsequent decoding processes as well as to weighting selected received coded data based on its estimated reliability prior to decoding.

2. Background of the Related Art

The process of transmitting digital information may in one sense be thought of as a four-step process as shown in FIG. 1. First, an incoming data stream of electrical digital signals $x(t)$ is coded by a coder 10 to produce coded information $C(x(t))$ that is provided to a transmitter 20 which transmits the coded information $C(x(t))$ over a communication medium 30. The coder 10 processes the data stream $x(t)$ so that the coded information $C(x(t))$ is robust to errors; that is, errors in the coded information $C(x(t))$ can be detected and corrected. This is necessary because, as will be seen, the transmission process introduces a noise component into the transmitted signal which would corrupt the signal and render it useless were it impossible to be removed.

In an exemplary case, the incoming data $x(t)$ is digitized audio such as voice or music from a known source; the coding unit 10 applies a coding transformation to the incoming data $x(t)$ to produce the coded information $C(x(t))$; and the transmitter 20 modulates a radio-frequency signal with the coded data $C(x(t))$ to send it as a radio-frequency signal through the atmosphere which serves as the communication medium 30.

In traversing the communication medium 30, the transmitted information $C(x(t))$ acquires a noise component $n(t)$, and the resultant signal $C(x(t))+n(t)$ received by a receiver 40 is decoded by a decoding unit 50 to recover the original data stream. Through the use of error-checking and correction properties of the coding algorithm employed by the decoder 50, the noise component $n(t)$ can be detected and removed from the received signal $C(x(t))+n(t)$, after which the signal $C(x(t))$ is processed in the decoder 50 using an algorithm complementary to the one used in the coder 10 to obtain the original data stream $x(t)$.

The term "noise" as used herein is intended to include any source of signal degradation, including but not limited to thermal noise, circuit noise and interference. For single carrier (equalized) systems, the preferred scheme includes identifying those bits in particular bit patterns that are most likely to be received in error, and weighting/puncturing those bits.

In the above example, the receiver 40 demodulates the received radio frequency signal to produce the received coded information $C(x(t))+n(t)$. The received coded information is error-checked and decoded by the decoding unit 50 to produce the outgoing digital data stream which might then be converted to an analog signal to be amplified for driving a speaker.

It is common in systems such as the one described above for the coder 10 to code $C(x(t))$ using a convolutional coding system. In contrast to a block code where a block of bits is coded according to a rule defined by the code without regard to previous inputs to the coder, a convolutional code additionally makes use of previous bits it processed in the coding process; thus, the coder 10 is a type of finite state machine.

An example of a convolutional coder of a type which might be used in the coder 10 is shown in FIG. 2A. As is evident from the coder block diagram, coding in this unit depends not only on the state of the current input bit $x_n$ but also on the state of the two previous input bits held in the two latches D. Consequently, the coder is a four-state machine as shown by its state diagram in FIG. 2B. From the state diagram it is relatively straightforward to derive the coder's trellis diagram as shown in FIG. 2C. Here, the branch to a particular state corresponding to a zero input is represented by a solid arrow, and the branch to a particular state corresponding to a one input is represented by a dotted arrow.

With the trellis diagram of FIG. 2C, the coding process will be readily apparent to those skilled in the art. Applying an input vector of, e.g., $\underline{X}=(1\ 1\ 0\ 1\ 0\ 1\ 1)$ produces outputs from the coder of FIG. 2A as shown in TABLE I (assuming the coder starts from an all-zero state).

TABLE I

| Input $x_I$ | Internal State $D_1 D_2$ | Output $y_1 y_2$ |
|---|---|---|
| 1 | 0 0 | 1 1 |
| 1 | 1 0 | 0 1 |
| 0 | 1 1 | 0 1 |
| 1 | 0 1 | 0 0 |
| 0 | 1 0 | 1 0 |
| 1 | 0 1 | 0 0 |
| 1 | 1 0 | 0 1 |
| 0 | 1 1 | 0 1 |
| 0 | 0 1 | 1 1 |

Thus, for the coder of FIG. 2A, $C(\underline{X})=(1\ 1\ 0\ 1\ 0\ 0\ 0\ 0\ 1\ 0\ 0\ 1\ 0\ 1\ 0\ 1\ 1)$.

If the communication medium 30 were error-free and the receiver 40 were assured of providing $C(\underline{X})$ to the decoder 50, it could recover the original data stream simply by applying $C(\underline{X})$ to the trellis network of the coder state machine and track the path therethrough which generated the sequence $C(\underline{X})$. For example, $C(\underline{X})=(1\ 1\ 1\ 0\ 1\ 0\ 0\ 0\ 0\ 1\ 0\ 0\ 1\ 0\ 1\ 0\ 1\ 1)$ would be generated by the path shown in FIG. 3, where states occupied by the coder are shaded and branches taken by the coder are in bold, with the corresponding coder output $C(\underline{X})$ given above each stage. From this, the original input sequence $\underline{X}=(1\ 1\ 0\ 1\ 0\ 1\ 1)$ can be obtained.

The above discussion and those hereinafter assume that the coder 10 and decoder 50 operate according to the same coding algorithm; that is, they both base their processing on the same coder circuit, state machine and the like; thus, dimensions of the trellis network necessary to accurately represent the coding algorithm are known to the decoder, the number of stages necessary in the trellis network is known, etc. Further, it is assumed that the coder state machine begins in an all-zero state, and that the input stream $\underline{X}$ is padded with a sufficient number of zeroes to return it to such a state at the conclusion of the coding/decoding process.

Assume now that the signal received and processed by the receiver 40 has a non-zero noise components $n(t)$, i.e., $C'(\underline{X})=C(\underline{X})+n(t)$. This might result in the decoding unit 50 receiving $C'(\underline{X})=(1\ 1\ 1\ 0\ 1\ 1\ 0\ 0\ 0\ 1\ 1\ 0\ 1\ 0\ 1\ 0\ 1\ 1)$, with the sixth and eleventh bits being errors due to $n(t)$. In this case, the original input sequence cannot be found simply by applying $C'(\underline{X})$ to the trellis of FIG. 2C. A typical error-correction algorithm used in this situation is the Viterbi error correction algorithm described as follows.

1. Given the trellis network, associate a metric with each stage in the trellis and set the metrics for all states in the first stage to zero.
2. For each state in the next stage, find the "distance" of each branch to it from the next-received subsequence of C'(X) and add it to the metric of the current state from which it branches.
3. Choose the minimum of the values calculated in Step 2 as the metric for the given stage in the next stage, and choose the branch leading to it as the survivor branch to that state.
4. Repeat Steps 2 and 3 until the end of the trellis network is reached.
5. Select the state in the last stage of the trellis network having the minimum metric and work backwards to the beginning by selecting survivor paths to produce the best guess about C(X).

If the coder is known to start from an all-zero state, the system is preferably designed so that traceback is always done to the all-zero state in the first stage. This can be done by, for example, initializing the all-zero state to zero and initializing the other states to large values.

Also, there are various techniques available to determine the state from which to begin a traceback. For example, at the end of a frame when the coder ends in a known state (in the example, 00), start the traceback from that known state.

Application of the Viterbi decoding algorithm to the corrupted stream C'(X) and the trellis network of FIG. 2C is shown in FIG. 4. Here,
the metric for a state is shown at its center;
the distance of a current subsequence from a given branch is shown by a number above the branch;
survivor branches (except for those in the best guess path) have a white arrowhead; and
the best guess path is in bold.

First, metrics of all states in the initial stage are set to zero. Then, the distance (here, the Hamming distance) between the subsequence 11 and each branch value is assigned to that branch. For the first node, the two branches are 00 and 11, so they receive values of 2 and 0. The next node has branches 01 and 10, so each of these branches receives a metric of 1. The third node has branches 11 and 00, so they respectively receive values of 0 and 2. Finally, the fourth node has branches 10 and 01 which each receive a Hamming distance of 1.

Then, for the first state in the second stage, the two branch values to it are 2 and 0, so its metric is set at 0 and the 0 branch from the third state in the previous stage is set as its survivor branch. For the second state in the second stage, the two branch values are 0 and 2, so its metric is set at 0 and the 0 branch from the first stage in the first stage is set as its survivor branch. Next, the third stage in the second stage receives values of 1 and 1, so its metric is set to 1 and one side is randomly or deterministically set as the survivor branch. Finally, the last state in the second stage receives values of 1 and 1, so it has a metric of 1 and both branches are set as survivor branches.

This process is repeated to the end of the trellis as shown in FIG. 4. Then, starting at the first node in the last stage (since it has the lowest metric of the last stage), survivor paths are traced back to the first stage. As can be seen from FIG. 4, the result is the same path traveled in the error-free case. Thus, the Viterbi algorithm has successfully eliminated the error contribution of n(t).

Although the Viterbi algorithm works well for situations such as those given above, it is not always practical to directly implement the algorithm in this way. For example, some communication systems make use of alternative information-carrying techniques such as quadrature amplitude modulation (QAM), which requires alternative methods of retrieving the received data stream. Additionally, some communication systems make use of interleaving and other techniques which restricts the type of decoding systems that can be used therein. Thus, there is a need for a decoding technique that addresses these issues.

Also, although the Viterbi algorithm works well for the situations described above, there are improvements that can be made to increase its usefulness. For example, consider the case of an OFDM system with interleaved data mapped to multilevel QAM constellation points. In this case, it is impossible to use Euclidean distance measurements to determine the proper weights to use in the algorithm, since the multiple bits represented by a single measurement are non-sequential in the trellis.

Further, the Viterbi algorithm in its current state does not allow for unequal weighting of bits based on knowledge of their error probability. This unequal error probability may be due to relative position in a multi-level constellation, or position in time, frequency, or space which is more or less likely to be susceptible to noise or interference than other positions.

Also, one of the primary burdens for wireless data transceivers, in terms of both processing latency and consumed integrated circuit real estate, is data decoding such as described above. Available wireless receivers fail to differentiate between reliable (good) and unreliable (bad) bits. Thus, even though bad bits are more difficult to decode and are often discarded once decoded, all bits, both good and bad, are presently utilized equally in available decoding processes. There is therefore a need in the art for a method of analyzing data to determine, in real time, its reliability and utilizing such information before decoding the analyzed data.

SUMMARY OF THE INVENTION

In view of the above deficiencies of the prior art, it is an object of the invention to provide a digital information decoding system which can be used in a wide variety of communication systems.

It is another object of the invention to provide a digital information decoding system that can be used with a wide variety of information demodulation techniques.

It is a further object of the invention to provide a digital information decoding system that can be used with interleaving digital communication systems.

It is yet another object of the invention to provide a technique for analyzing data to determine, in real time, reliability of received data and using such information in decoding the analyzed data.

The above objects are achieved according to a first aspect of the present invention by providing a Viterbi decoding system which interprets bits in received QAM constellations as many-valued parameters rather than binary valued parameters. It performs the Viterbi algorithm using these many-valued parameters to provide results superior to hard decision decoding. Rather than applying a hard 0-1 function to the QAM data, the system uses a non-stepped linear or curved transfer function to assign values to the bits.

According to another aspect of the invention, these objects are achieved by providing a system which differentiates between data bits based on their estimated reliability, giving more emphasis to decoding reliable bits than unreliable bits using any of a variety of techniques. By differentiating between good and bad bits and de-emphasizing or ignoring unreliable bits, the system can provide a significant reduction in uncorrectable errors and packet loss.

According to another aspect of the invention, this process of selective weighting or "puncturing" enables the discarding ("hard puncturing") or de-emphasizing ("soft puncturing") of received bits deemed less reliable than a particular minimum threshold level. Within a multi-carrier environment, such a scheme further involves identifying which carriers have poor signal-to-noise ("SNR") characteristics and attendant high error rates, and puncturing/weighting bits in the identified carriers.

BRIEF DESCRIPTION OF THE DRAWINGS

These and other objects, features and advantages of the present invention are better understood by reading the following detailed description of the preferred embodiment, taken in conjunction with the accompanying drawings, in which.

DETAILED DESCRIPTION OF PRESENTLY PREFERRED EXEMPLARY EMBODIMENTS

The above arrangement described in the Background section works relatively well if the digital information is used to modulate the carrier signal directly; however, this is not always the case. For a variety of reasons, some communication systems employ alternative arrangements. For example, the IEEE 802.11a communication standard uses a quadrature amplitude modulation (QAM) system in which the modulated carrier signal does not directly correspond to the information being transmitted, but to a position in a two-dimensional array or "constellation" of possible binary values. This constellation is known to the sender and receiver, so that a position transmitted to a receiving station can be accurately correlated with a corresponding digital sequence in the constellation.

Figure 5:
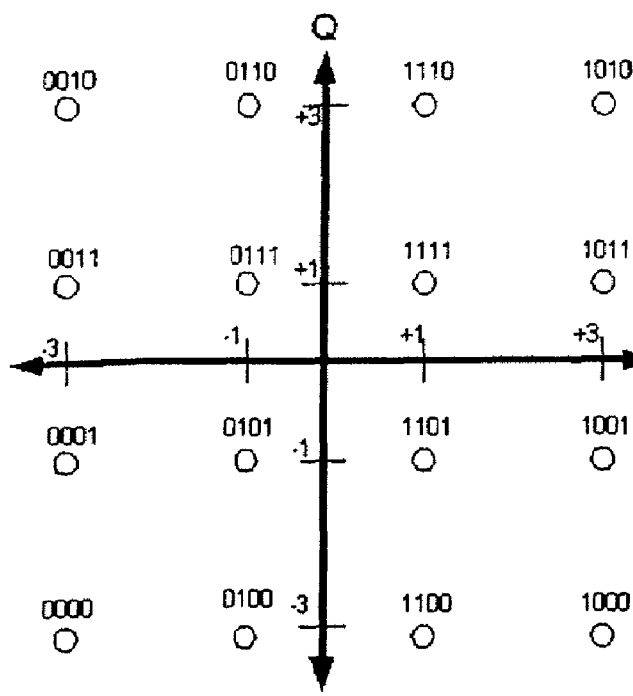
FIG. 5 shows a QAM constellation according to the prior art.

Consider FIG. 5. This is a constellation which might be used in a 16QAM (16 bit quadrature amplitude modulation) coding system. Here, rather than providing a single digital output to the decoder 50, the receiver 40 would generate two signals I and Q. So, a data point (I, Q) P of, e.g., (1, −3) would correspond to the binary sequence 1100. This sequence 1100 could then be applied to the Viterbi trellis as a received subsequence as described above.

In this case, noise effects from the communication medium 30 could vary I and Q so that they do not point directly to the appropriate constellation point. For example, rather than (1, −3) the receiver 40 may generate a data point P' of (1.25, −2.75). This may be dealt with using either a hard decision decoding process or a soft decision decoding process.

In the soft decision decoding process, a Euclidean distance measurement is used to determine the constellation point corresponding to the received (I, Q) point. For P'=(1.25, −2.75), the distances are $$D_{1100} = \sqrt{(1.25 - 1)^2 + (-2.75 + 3)^2} \approx 0.35$$

$$D_{1000} = \sqrt{(1.25 - 3)^2 + (-2.75 + 3)^2} \approx 1.77$$

$$D_{1101} = \sqrt{(1.25 - 1)^2 + (-2.75 + 1)^2} \approx 1.77$$

$$D_{1001} = \sqrt{(1.25 - 3)^2 + (-2.75 + 1)^2} \approx 2.47$$

and so on with increasing distances. This distance would then be used in branch metric computation in the rest of the process of Viterbi decoding.

Figure 6A:
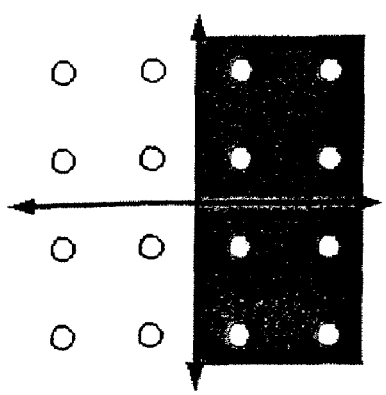
FIGS. 6A-6D show bitwise decision decoding functions for the QAM constellation of FIG. 5.

In the hard decision decoding process, a separate determination is made for each bit as to whether it is a 0 or a 1. For example, given the 16QAM constellation of FIG. 5, a hard decision metric for b0 would be $I>0 \rightarrow b_0=1$ as shown in FIG. 6A, wherein the shaded portion of the constellation indicates the area in which bit b0 should be decided to be a binary 1. A complete set of hard decision metrics would be $I>0 \rightarrow b_0=1$ (FIG. 6A)

Figure 6B:
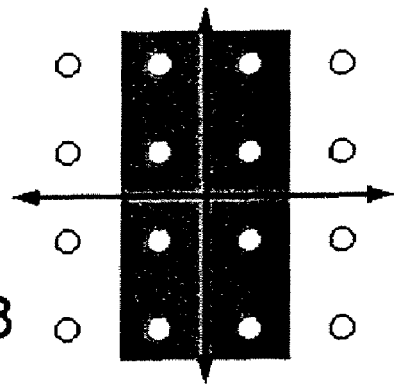

$|I|<2 \rightarrow b_1=1$ (FIG. 6B)

Figure 6C:
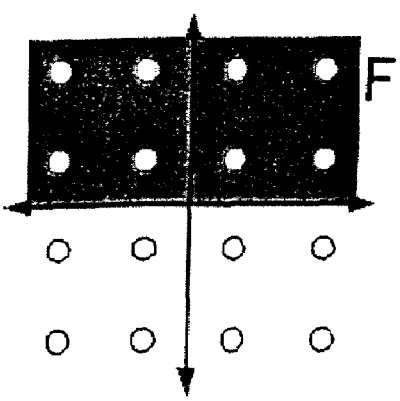

$Q>0 \rightarrow b_2=1$ (FIG. 6C)

Figure 6D:
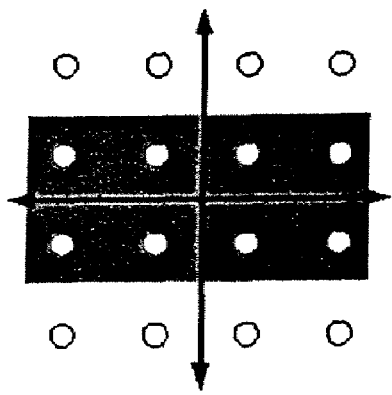

$|Q|<2 \rightarrow b_3=1$ (FIG. 6D)

Figure 7A:
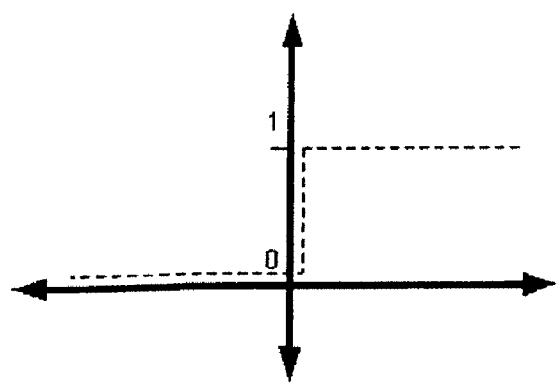
FIGS. 7A and 7B show transfer curves corresponding to the decoding functions of FIGS. 6A and 6B.
Figure 7B:
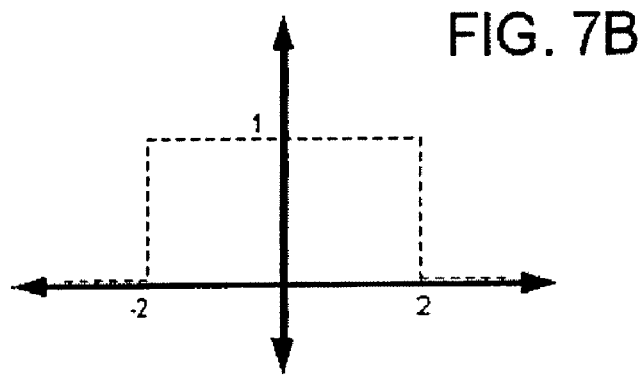

The transfer curve corresponding to, e.g., FIG. 6A ($I>0 \rightarrow b_0=1$) is shown in FIG. 7A, and the transfer curve corresponding to FIG. 6B ($|I|<2 \rightarrow b_1=1$) is shown in FIG. 7B. It should be noted that in FIGS. 7A and 7B the curves are shown offset from the graph axes for illustration purposes only, and it will be understood that, e.g., FIG. 7A has a step precisely on the abscissa. It will be apparent that similar curves can be produced for FIGS. 6C and 6D.

Figure 8A:
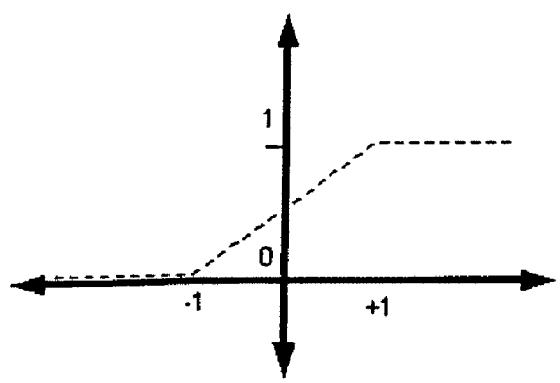
FIGS. 8A and 8B show transfer curves according to a first preferred embodiment of the present invention.
Figure 8B:
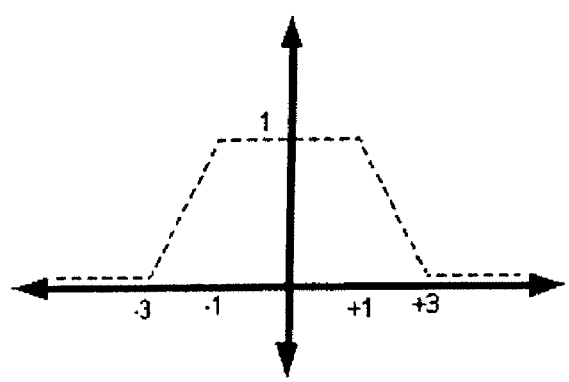

As an alternative to such hard decision decoding, a preferred embodiment of the present invention uses linear functions in place of the step functions shown in FIGS. 7A and 7B. Two such functions are shown in FIGS. 8A and 8B. The curve shown in FIG. 8A is the counterpart of the curve for $b_0$ shown in FIG. 7A, and the curve shown in FIG. 8B is the counterpart of the curve for $b_1$ shown in FIG. 7B. Similar curves apply to $b_2$ and $b_3$. As before, the curves have been offset from their respective axes for ease of explanation and preferably are not so offset in actual use. Also, the angles of the transitional portions (or, alternatively, the positions at which the transitional portions begin and end) have been chosen arbitrarily for purposes of illustration only, and are preferably selected as will be described in greater detail below.

A complete set of hard decision metrics can be derived from these graphs thusly:

| | |
|---|---|
| $I \leq -1 \rightarrow b_0 = 0$ | $Q \leq -1 \rightarrow b_2 = 0$ |
| $-1 < I < 1 \rightarrow b_0 = (I + 1)/2$ | $-1 < Q < 1 \rightarrow b_2 = (Q + 1)/2$ |
| $I \geq 1 \rightarrow b_0 = 1$ | $Q \geq 1 \rightarrow b_2 = 1$ |
| $I \leq -3 \rightarrow b_1 = 0$ | $Q \leq -3 \rightarrow b_3 = 0$ |
| $-3 < I < -1 \rightarrow b_1 = (I + 3)/2$ | $-3 < Q < -1 \rightarrow b_3 = (Q + 3)/2$ |
| $-1 \leq I \leq 1 \rightarrow b_1 = 1$ | $-1 \leq Q \leq 1 \rightarrow b_3 = 1$ |
| $1 < I < 3 \rightarrow b_1 = (3 - I)/2$ | $1 < Q < 3 \rightarrow b_3 = (3 - Q)/2$ |
| $I \geq 3 \rightarrow b_1 = 0$ | $Q \geq 3 \rightarrow b_3 = 0$ |

The above formulae may be used as is to implement the preferred embodiment; alternatively, the I and Q values could be compared to a lookup table to find the appropriate bit value (this approach becomes increasingly preferred as the complexity of the formulae increases). For example, a single table might be used for b0 and b2 and when given an I or Q value of, say, 0.75, would indicate that the corresponding bit value is 0.875.

A complete set of bitwise soft decision metrics could also be derived from these graphs:

| 16-QAM | | | |
|---|---|---|---|
| INPUT | MSB | INPUT | LSB |
| $I < -2$ | 0 | $4 < |I|$ | 0 |
| $-2 < I < 2$ | $(I + 2)/4$ | $|I| < 4$ | $1 - |I| * 0.25$ |
| $2 < I$ | 1 | | |

| 64-QAM | | | |
|---|---|---|---|
| INPUT | MSB | INPUT | MID. SIG. B |
| $I < -2$ | 0 | $6 < |I|$ | 0 |
| $-2 < I < 2$ | $(I + 2)/4$ | $|I| < 2$ | 1 |
| $2 < I$ | 1 | $2 < |I| < 6$ | $1 - (|I| - 2) * 0.25$ |

| INPUT | LSB |
|---|---|
| $|I| < 4$ | $|I| * 0.25$ |
| $4 < |I| < 8$ | $(8 - |I|) * .25$ |
| $8 < |I|$ | 0 |

It is noted that the references above to MSB, LSB and MID. SIG. B are to the most, least and middle significant bits, which are each pairs of bits that make up the constellation. Further, the Q values are the same as the I values provided above.

These metrics have a number of advantages. First, they are able to provide soft decision values to data that may not be able to be directly decoded via soft decision decoding using Euclidean distances, providing an advantage over the alternative of hard-decision decoding. Secondly, these metrics provide a more extreme weight when the position is further from the transition region. For example, in the absence of noise, a 64-QAM I-channel input of 1, 3, 5, or 7 corresponds to a 1 for the msb. However, an input of 1 is on the transition edge, and could be noisy, so it is given a lower weight (0.75) compared to anything greater than a 2, which is far enough away from the transition edge to be more certain of the value of the msb. This allows the algorithm to provide more weight in decoding where there is more certainty, providing a greater chance of correctly decoding all of the bits.

These metrics can be weighted further based on knowledge of the probability that the symbol is in the presence or absence of noise or interference of any kind. This degradation may be due to any effect in time, space, or frequency, such as an interferer or a poor channel response in a given frequency bin for an OFDM signal, or an intermittent interferer arriving in given symbols in time, or a given antenna receiving a weak signal in space, or any combination of any effect in these three independent domains. For example, in the 802.11a instantiation of this discussion, we may use our channel estimate to detect frequency bins which may possess low SNR due to interference or channel response. All soft decisions from these frequency bins can then be weighted according to a predetermined estimate of their reliability, giving more weight to the reliable bits and further increasing the ability to decode all bits correctly.

Figure 1:
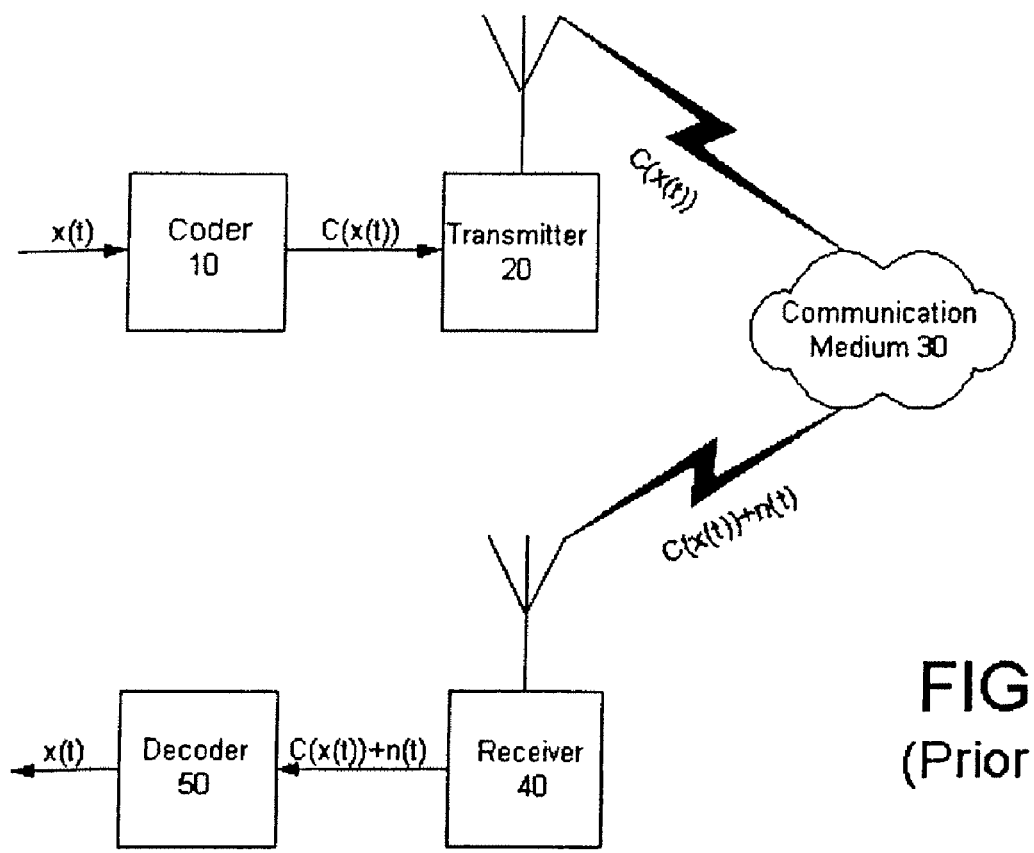
FIG. 1 is a block diagram of a digital communication system according to the prior art.
Figure 2A:
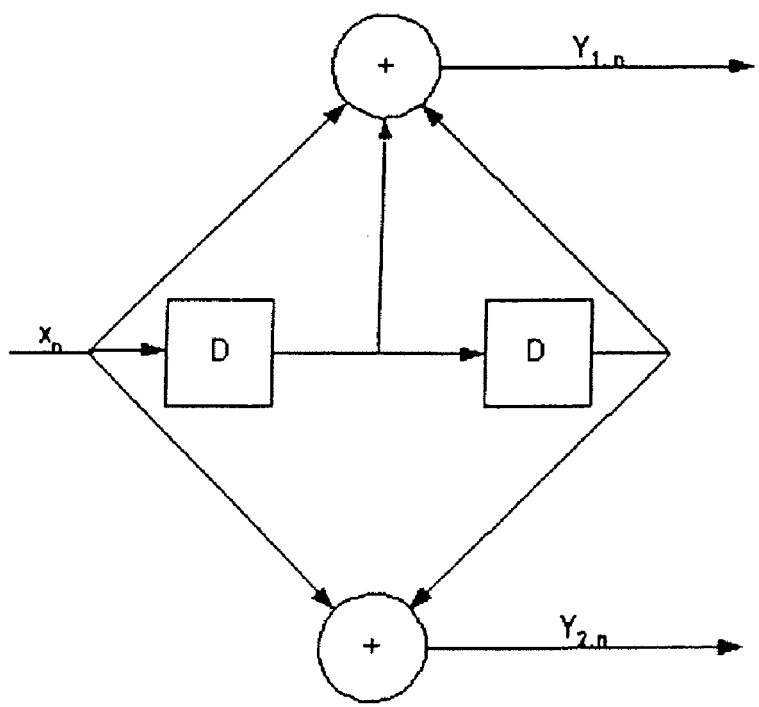
FIG. 2A is a diagram of a convolutional coder used in the system of FIG. 1.
Figure 2B:
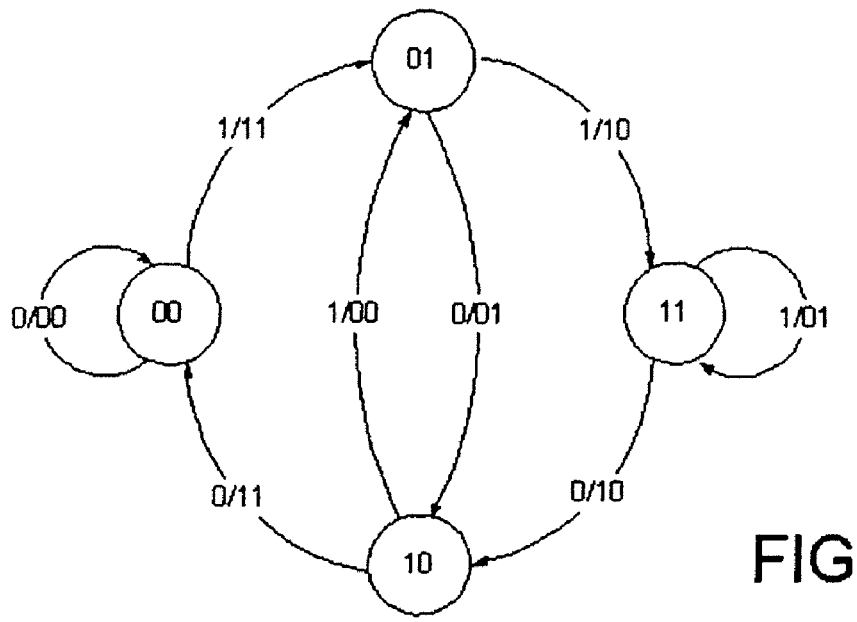
FIG. 2B is a state diagram of the coder.

The bit values calculated above are then used in the Viterbi decoding algorithm similarly to the above—the bit values are used as received binary subsequences, and metrics of trellis branches and states are calculated therefrom. Consider the example of FIGS. 2 and 3, where in place of C($\underline{X}$)=(1 1 1 0 1 0 0 0 0 1 0 0 1 0 1 0 1 1) we have a 16QAM system in which the received (I, Q) pairs are [(−0.5, +1.6) (−3.4, −1.2) (−2.7, +3.2) (−0.7, −1.4) (−2.5, +0.9)], which generally corresponds to the same sequence with some noise added. Applying the above transfer functions, the following "bit" sequences are obtained:

(0.7, 1, 1, 0.25) corresponding to 0 1 1 1;
(0.9, 0, 0, 0) corresponding to 0 0 0 1;
(0, 1, 0.15, 0) corresponding to 0 0 1 0;
(0.8, 0, 1, 0.15) corresponding to 0 1 0 1; and
(1, 0.95, 0.25, 0) corresponding to 0 0 1 1.

Figure 2C:
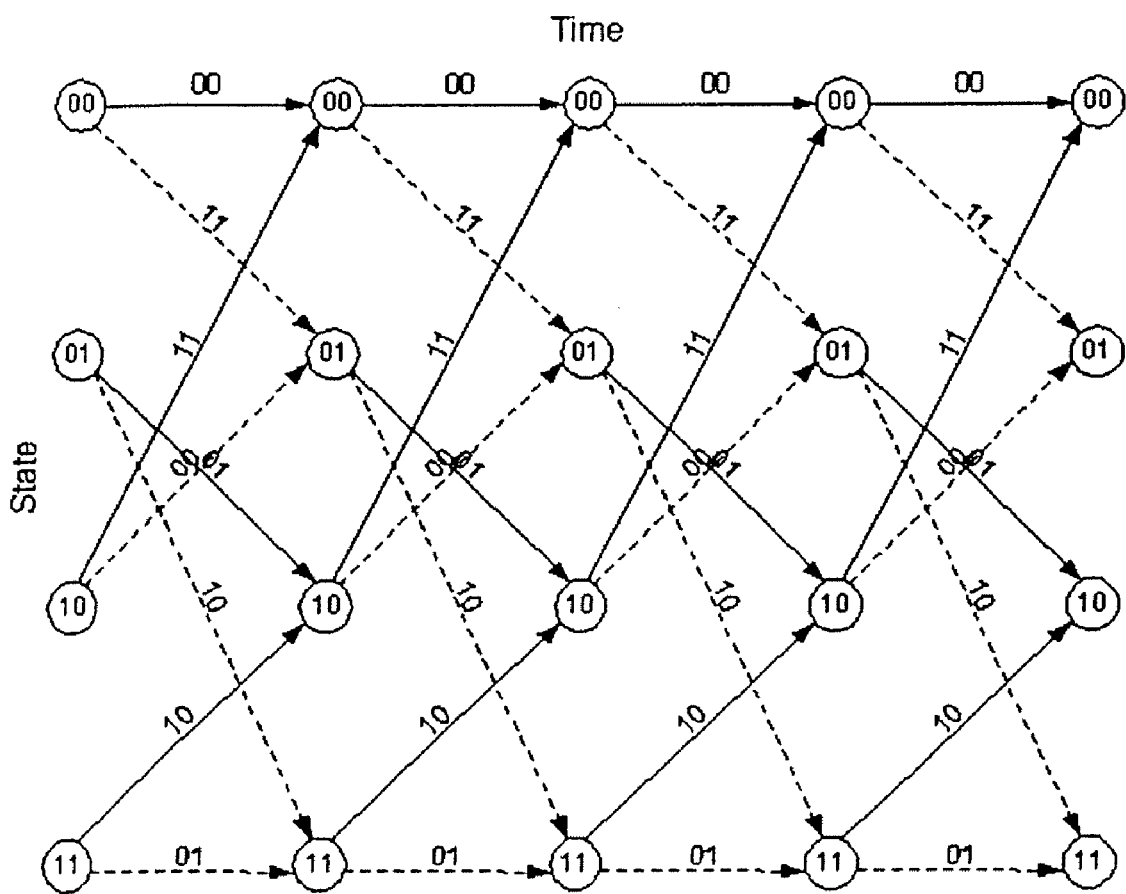
FIG. 2C is a trellis network of the coder.
Figure 3:
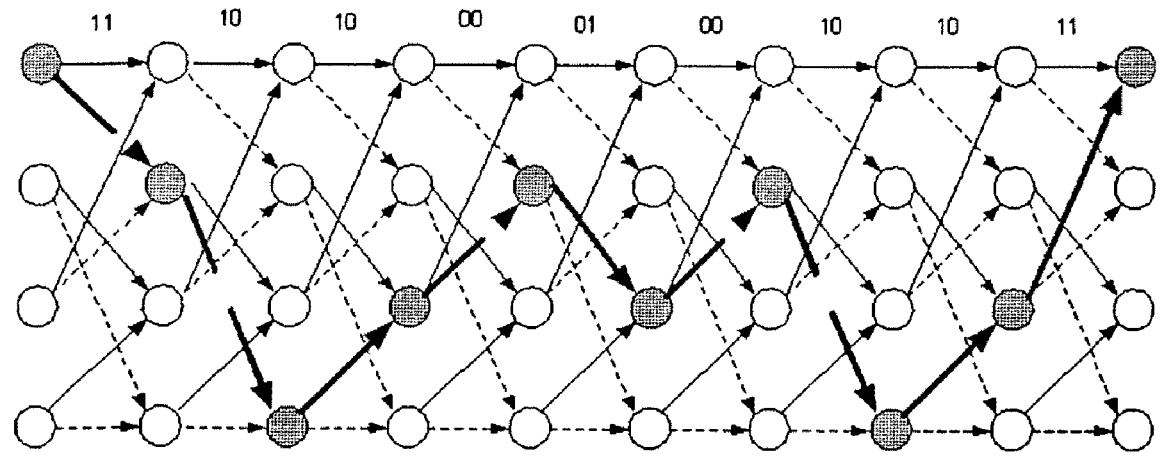
FIG. 3 shows use of the trellis network in decoding an error-free output data stream from the coder of FIG. 2.
Figure 4:
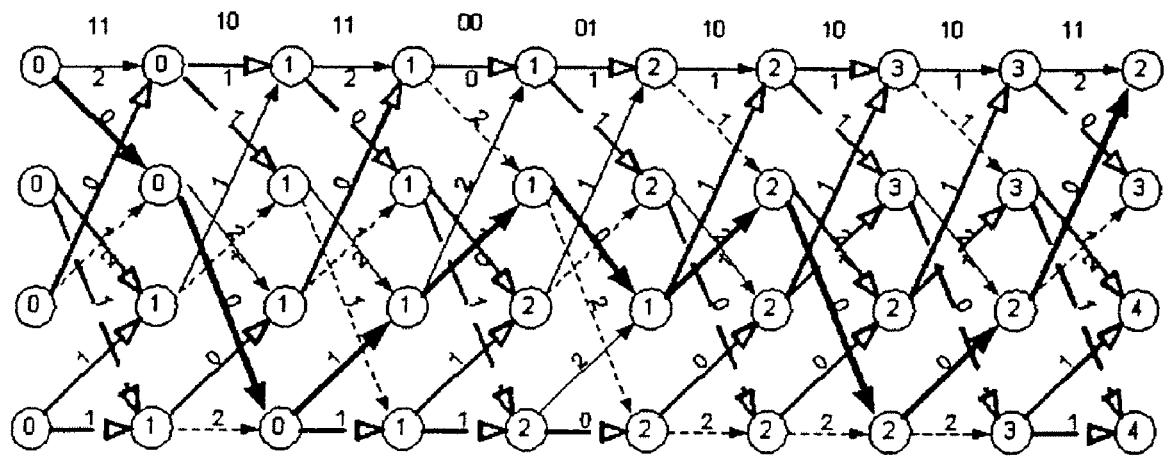
FIG. 4 shows use of the trellis network in decoding an output data stream from the coder of FIG. 2 having errors.
Figure 9:
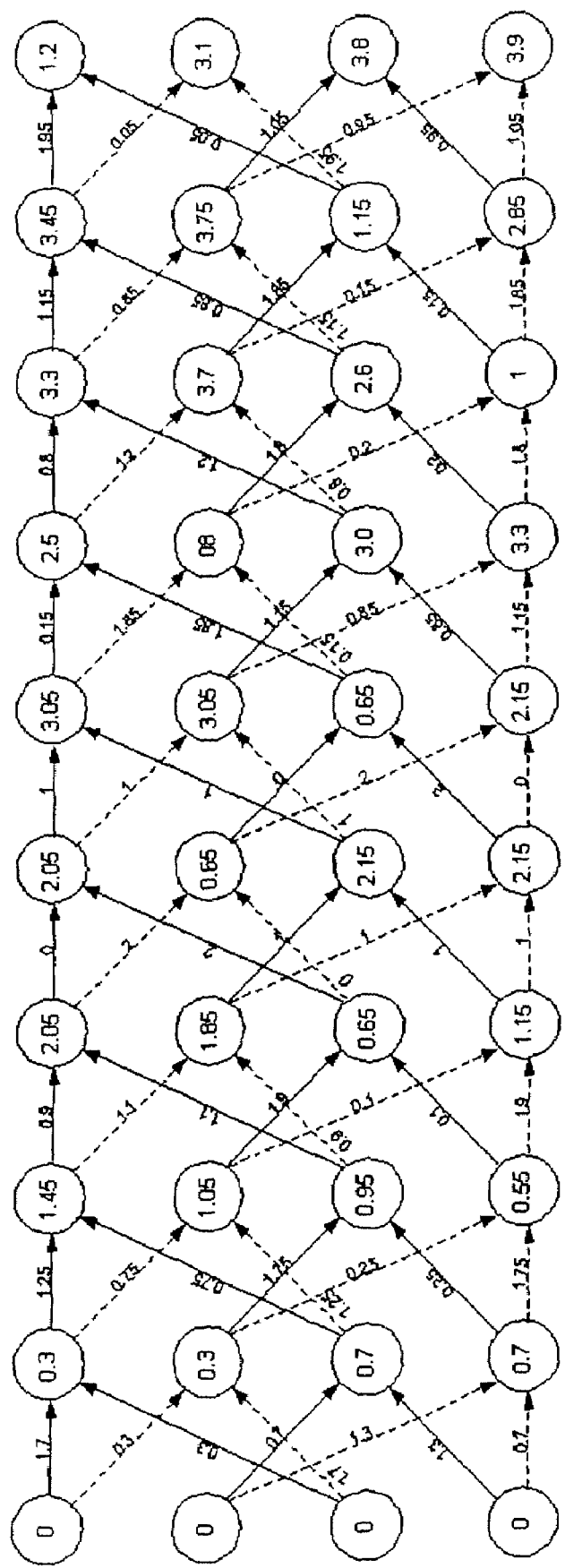
FIG. 9 shows use of a trellis network in decoding a QAM output data stream having errors.

Applying these figures to the trellis diagram of FIG. 2C obtains the weighted trellis shown in FIG. 9. By working backward from the least-cost path in the last stage as above, the best guess state transition path of the coder 10 can be obtained, and from that the original input sequence as before.

It should be noted that although the above computations have been illustrated using the decimal system for ease of illustration, in practice it will likely be more convenient to calculate the partial bit values as n-bit binary values, with each binary step corresponding to an increase of $\frac{1}{2}^n$ from the next lower value. In the preferred embodiment n=4–(5), which was chosen as a tradeoff between hardware complexity and decoder performance; other values will also prove workable.

So, a bit value of 0.5 would be represented by a value of 10000, a value of 0.8 might be rounded up to 11001 (0.8006), etc. Slightly larger accumulators can be used to store the state metrics; a six bit accumulator could be used to store any of the state metrics shown in FIG. 9. This will simplify circuitry implementing the embodiment immensely and speed it up a great deal.

Generally speaking, more than six bits might be required in the accumulator, especially when more than nine bits are decoded. Also, those of ordinary skill in the art will recognize that techniques are known for limiting the required number of state metric bits, even for frames of arbitrary length.

It will also be appreciated by those skilled in the art that a number of different fabrication technologies may be used to implement the preferred embodiment—lower throughput systems may be implemented in software, while higher throughput systems may use a hardware-oriented approach such as a custom chip, an FPGA, a gate array or the like.

Figure 10A:
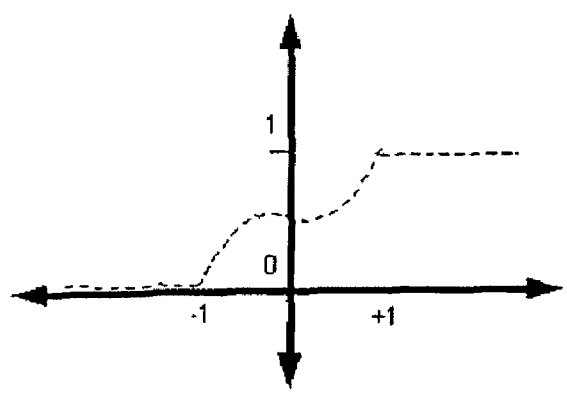
FIGS. 10A and 10B show transfer curves according to a first preferred embodiment of the present invention.

A second preferred embodiment of the present invention is similar to the first in its use of many-valued bit values; however, in the second embodiment the transitional portion of the curves are not linear but curved. FIG. 10A shows the transfer curve for $b_0$ and $b_2$, and for $b_1$ and $b_3$, corresponding to FIGS. 7A/8A and 7B/8B, respectively. The transitional portions of these curves generally can be expressed either in formulae such as those below (using the Q parameter for exemplary purposes) or, in practice, in a lookup table.

Figure 10B:
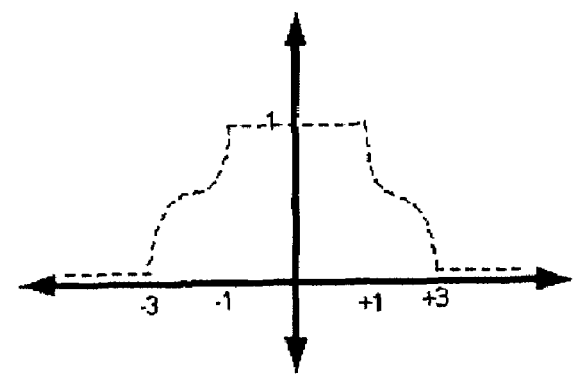

For FIG. 10A, $Q \leq -1 \rightarrow \text{bit} = 0$ $-1 < Q < 0 \rightarrow \text{bit} = \frac{1}{2} - \frac{Q^2}{2}$ $0 < Q < 1 \rightarrow \text{bit} = \frac{1}{2} + \frac{Q^2}{2}$ $Q \geq 1 \rightarrow \text{bit} = 1$ For FIG. 10B, $Q \leq -3 \rightarrow \text{bit} = 0$ $-3 \leq Q \leq -2 \rightarrow \text{bit} = \frac{1}{2} - \frac{(Q+2)^2}{2}$ $-2 \leq Q \leq -1 \rightarrow \text{bit} = \frac{1}{2} + \frac{(Q+2)^2}{2}$ $-1 \leq Q \leq 1 \rightarrow \text{bit} = 1$ $1 \leq Q \leq 2 \rightarrow \text{bit} = \frac{1}{2} + \frac{(Q-2)^2}{2}$ $2 \leq Q \leq 3 \rightarrow \text{bit} = \frac{1}{2} - \frac{(Q-2)^2}{2}$ $Q \geq 3 \rightarrow \text{bit} = 0$ Of course, these formulae are only exemplary, and a wide variety of non-linear transitional curves may be used in their place. For example, having a steeper transition near the flat parts of the functions can produce slightly better results than a linear transition region.

Figure 11:
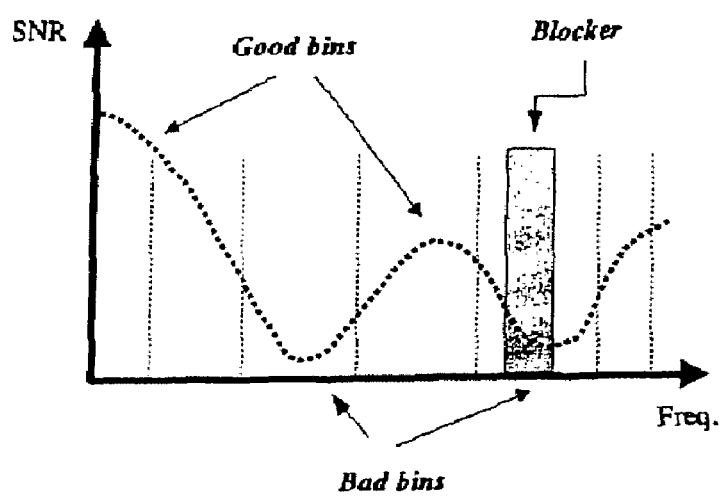
FIG. 11 shows channel frequency response with blocker signals or other interference present.

Generally, an embodiment according the invention described above allows a receiver to independently differentiate predictably reliable data from predictably unreliable data. Both single carrier and multicarrier bit transmissions often provide sporadic, unreliable data. For example, in a single carrier system in which the channel bandwidth is narrow within the context of a selected bit transmission rate, it is often difficult to accurately receive sequences containing long strings of uninterrupted 1's or 0's. Similarly, bits transmitted through fading channels in a multi-carrier system can be problematic, as can bits contaminated with frequency dependent noise (i.e., bits transmitted at lower frequencies are less reliable than those transmitted at higher frequencies) and subject to other non-ideal transmission conditions. FIG. 11 illustrates an example of the distinction between good and bad data in a multicarrier environment.

Figure 12:
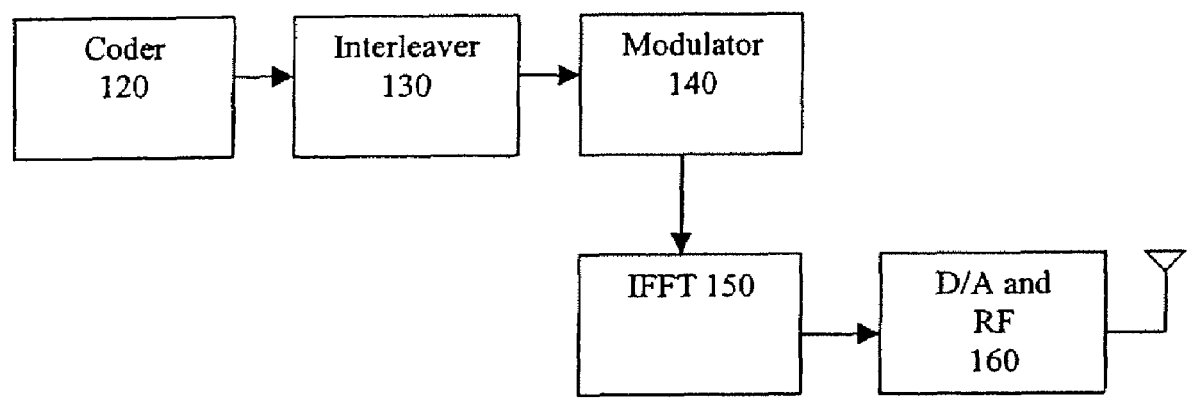
FIG. 12 is a block diagram of a transmitter in an OFDM system.

The following is a discussion of the preferred puncturing method and system within the context of a multi-carrier environment that allows for the differentiation noted above. Assume a Coded Orthogonal Frequency Division Multiplexed ("C-OFDM") transmission within a wireless LAN environment, such as the environment provided by the IEEE 802.11a protocol. In such a C-OFDM environment, such as illustrated in the transmitter 100 shown in FIG. 12, blocks of input bits are first coded using a coder 120 (redundancy is added to the bits to correct future errors) and then interleaved with interleaver 130 (the bit order is changed in a known, pseudo-random manner). The coded and interleaved block is then passed to a modulator 140, which maps the block to a constellation point using, for example, gray codes. Once modulated, the modulated signal is passed to an Inverted Fast Fourier Transform ("IFFT") module 150 as illustrated in FIG. 12. Every nth bits from the block (such as 1, 2, 4, and 6 bits for BPSK, QPSK, 16QAM, and 64QAM modulation techniques, respectively) modulates one of forty-eight available carriers. The multicarrier symbol is then modulated to the RF frequency using a conventional D/A and RF amplification circuit 160 and transmitted over an antenna and received at the receiver 200, which is illustrated in more detail in FIG. 13, described below.

For the sake of the provided example, a ½ rate coded stream will be assumed, wherein the coder adds a redundant bit for every input bit, thereby doubling the number of bits transmitted for a given amount of data. In order to reduce part of this overhead, some of the coded bits may not be transmitted—that is, they may be hard punctured at the transmitter—providing, for example, a resulting ¾ rate code, as is conventional. However, the Viterbi forward error correction ("FEC") decoder, unaware of any hard puncturing that may have occurred on the transmitter side, decodes the received bits as if they were transmitted as ½ rate code. The hard punctured bits are therefore added to the received bits at the receiver before being passed into the Viterbi decoder and decoded as normal ½ rate code. However, the Viterbi decoder is also given the location of the hard punctured bits so that those bits are not used in calculating the norm of the difference between the received bit and the expected bit on the Viterbi trace (generally known as the distance metrics). In this case, all distance metrics are zeroed out (hard punctured). The hard punctured bits will therefore have no actual effect on the decoding process, and the performance of the error correction capability of the Viterbi depends only on the non-punctured bits. This hard puncturing operation is performed at the transmitter to allow a higher data rate of transmission at the expense of less redundancy.

The present invention can implement at the receiver the soft or hard puncturing of bits that were transmitted but not deemed as worthwhile as other bits using the same mechanism for the bit metric puncturing or weighting that is used when hard puncturing from the transmitter, as described herein. Thus, in a preferred implementation of the present invention, any bit can be flagged to be soft or hard punctured. The Viterbi decoder can discard flagged bits from its metric calculations (hard puncturing) or de-emphasize certain bits by weighting the associated distance metric (soft puncturing). Through these methods, better bits get higher weighting in the Viterbi decoding process (distance metric calculations), and worse bits either get lower weights or get punctured (if below a threshold, which could be dynamic).

Figure 13:
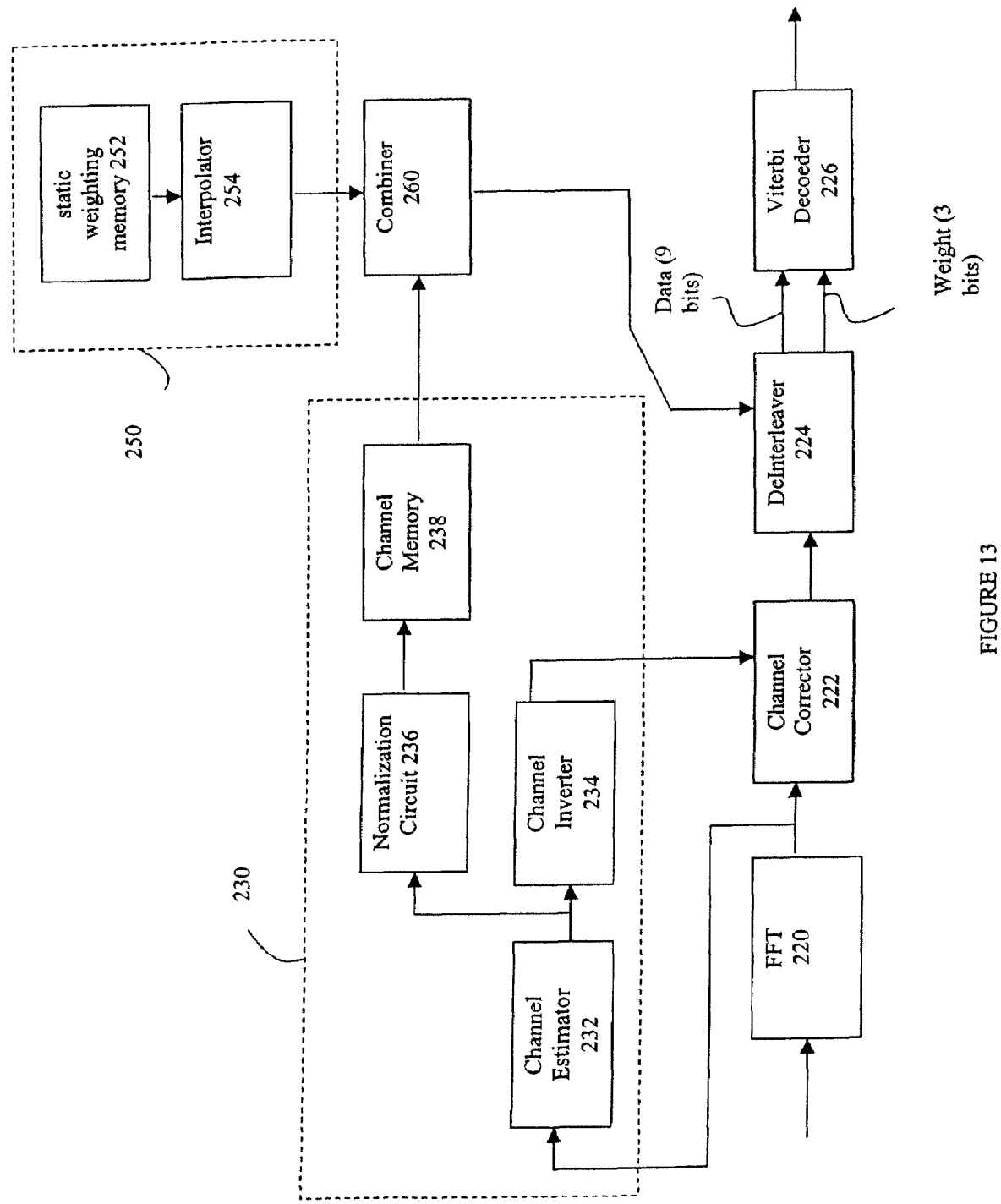
FIG. 13 is a block diagram of a receiver in an OFDM system.

A further description of the receiver 200 that can provide for both soft and hard puncturing according to the present invention will now be described with reference to FIG. 13, with particular attention provided to those modifications necessary to a conventional receiver to implement the present invention being described. Hard puncturing will not, however, be described differently than soft puncturing, since hard puncturing as used herein is a degenerate case of soft puncturing, in which a weight is set to zero and hard puncturing of the bit metric results.

As shown, the receiver 200 includes a front end/analog to digital converter 212 and timing recovery circuit 214 and fast Fourier transform (FFT) circuit 220 that operate in a conventional manner. Further, as described herein, the channel correction circuit 222, deinterleaver circuit 224 and Viterbi decoder 226 also operate in a conventional manner, except that the inputs received by these circuits are modified due to the establishment of the weighting values described herein that are used to implement the soft puncturing that takes place.

An overall description will initially be provided. As shown, the output from FFT 220 is also input into a dynamic channel weighting circuit 230. The dynamic channel weighting circuit 230 provides a dynamic weighting, as described herein, that is associated with dynamic characteristics based upon dynamic changes in channel performance, for each of the bins in the channel. This dynamic weighting is combined with a static weighting, obtained from a static channel weighting circuit 250, for each of the bins in the channel, in a combiner 260. The resulting channel weight is then used to alter the value of the bit metrics used by the Viterbi decoder 226 when making branch metric calculations.

Further details will now be provided. The dynamic channel weighting circuit 230 includes a channel estimator 232, which, as known, can provide an estimate of the performance of each of the bins in the channel.

The channel estimate for each of the bins is output to channel inverter 234, which obtains an inverse of the channel estimate, which inverse can then be applied to the channel correction circuit 222 in order to assist in improving the signal.

The output from the channel estimator 232 is also applied to a normalization circuit 236. The normalization circuit normalizes the signal for each of the channel bins in some manner, to determine whether the signal has a sufficient strength that suggests it should be fully weighted by the Viterbi decoder, or has some lesser strength, which thus warrants a dynamic weighting value that attributes less significance to the particular signal. The channel estimate is used to determine the strength of the signal, which is then compared to the normalized signal. The signal strength is typically obtained in terms of the power or magnitude of the signal corresponding to each bin in the channel, as output from the FFT 226. The usage of power, calculated as $I^2+Q^2$ (which can be derived from the I and Q obtained as a result of the channel estimate) for the complex channel estimate for each bin, is preferred, since to calculate a magnitude, a square root function is required to calculate an absolute value, thereby simplifying the calculation, since there is a 1 to 1 mapping of power to magnitude.

A specific example of dynamic weighting values for various thresholds is provided in the table below:

| Weight | Magnitude Threshold | Power Threshold |
| --- | --- | --- |
| 1 | $\sqrt{2/2}$ | 1/2 |
| 1/2 | $\sqrt{2/4}$ | 1/8 |
| 1/4 | $\sqrt{2/8}$ | 1/32 |
| 1/8 | $\sqrt{2/16}$ | 1/128 |
| 1/16 | $\sqrt{2/32}$ | 1/512 |
| 0 | N/A | N/A |

For proper interpretation, any bin with a power estimate between 1/4 and 1/2 of the max magnitude gets weighted by 1/2 in the Viterbi decoder 226, assuming that there is no static weighting component, as described hereinafter.

Thus, in a preferred embodiment of the invention, different dynamic weighting values, which can be represented by three bits, are used. The dynamic weighting values that are less than 1 are derived based upon an amount that the signal deviates from some normalized signal value. This normalized signal value could be, for example, the maximum power or magnitude or the mean power or magnitude of the signals in the channel. In any event, for each signal value that is further from the normalized signal value, that signal value is associated with a progressively lesser weight, as illustrated above. Accordingly, based upon the strength of the signal, a corresponding dynamic weighting value is derived, which is then stored in a channel memory 238.

For each of the bins in the channel, the corresponding dynamic weighting value is then output from the channel memory 238 and input into the combiner 260.

The combiner 260 will combine, in a manner more fully described hereinafter, each dynamic weighting value with a corresponding static weighting value obtained from static channel weighting circuit 250.

Static channel weighting circuit 250 will now be described in further detail. Before providing such further description, however, it is noted that the term static is used with respect to this weighting circuit not to suggest that these weights do not change, but to distinguish these weights from those that are obtained through usage of the channel estimates, as described above. Further, typically, the nature of the interference which results in the static channel weighting values will occur for a longer period of time, though that does not necessarily need to be the case. An example of an interferer that may cause a static weight that will lower the significance of the signal in the Viterbi decoder 226 is circuit noise at a predetermined frequency corresponding to a particular bin within the channel currently being used.

As illustrated, static channel weighting circuit 250 includes a static weighting memory 252 that stores a channel performance table. In the preferred embodiment, the channel performance table includes initial static weight values for each bin of each channel of interest. Each initial static weight value for each bin can be influenced by various factors, some of which may be entirely static, but many of which will change over time. Examples of factors that can change these initial static weight values are discussed further hereinafter.

For a given bin in a given channel that has its dynamic weight value read out of channel memory 238, a corresponding initial static weight value will be output from the memory 252 to interpolator 254. Interpolator 254 will adjust the initial static weight value for specific predefined operational characteristics. For example, the interpolator 254 may be provided with the rate at which data is being transmitted, the determined frequency offset, as well as the analog front end gain currently being used. Interpolator 254 will then adjust the corresponding initial static weight value to determine an actual static weight value. The rate and analog gain settings used will either turn on or off the soft puncturing of certain bins, or will scale the amount of puncturing. The estimated frequency offset will be used to shift which bins are punctured. Interpolator 254 will also preferably scale by a power of 2 when obtaining the actual static weight value. Thus, while the interpolation is somewhat coarse, with a thresholded frequency offset, and a predefined, power of 2-based interpolation function, a more complex scheme is not necessary.

As noted above, the actual static weight value is then combined with the corresponding dynamic weight value, for each bin of the channel. In the preferred embodiment, with the specific weights discussed above, the combiner 260 is implemented as a look-up table emulating a simple multiplier. The resulting bin weight value is then output to the deinterleaver, which will store the resulting bin weight value along with the corresponding deinterleaved data signal in a buffer contained therein, so that both can be output at the same time for usage by the Viterbi decoder 226, as discussed generally above and which will be described more fully below. The deinterleaved data signal contains the I or Q value, as appropriate, for a given coded bit, as well as the bit position (msb, lsb) of that bit in the constellation to determine which bit metric table to use.

Figure 14:
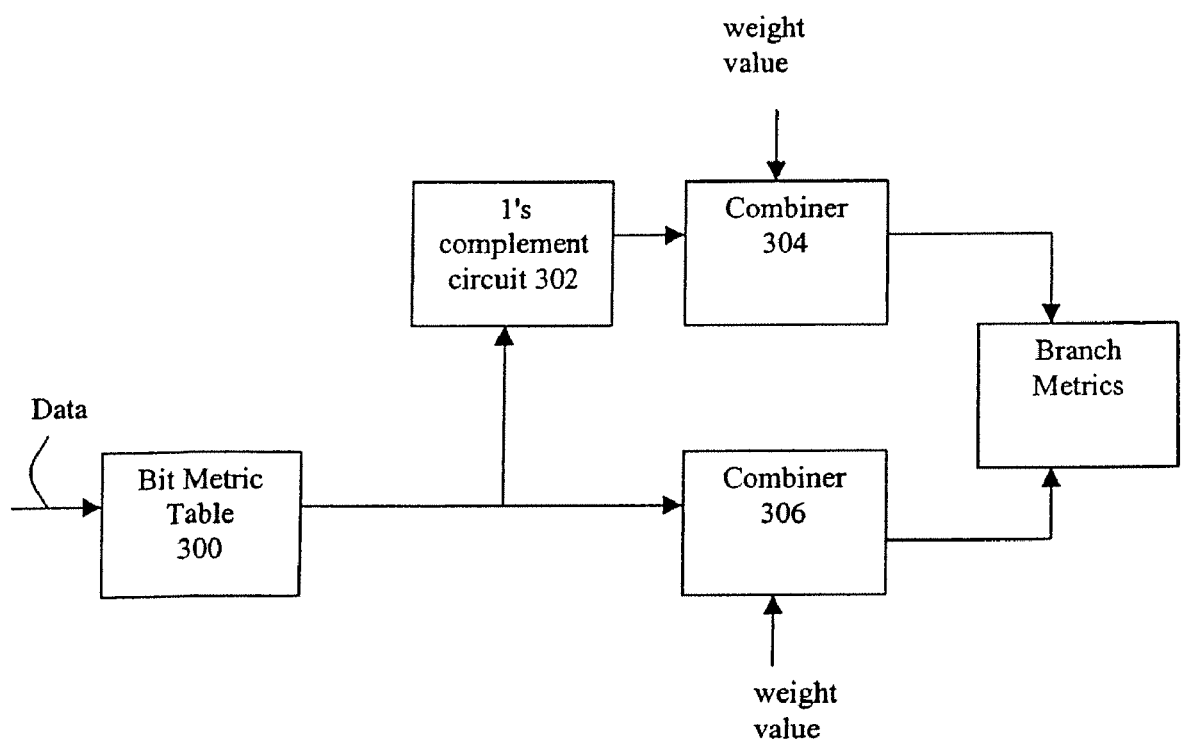
FIG. 14 shows a portion of the Viterbi decoder according to the present invention.

Within the Viterbi decoder 226, a portion of which is illustrated in FIG. 14, the deinterleaved data signal is input into a bit metric table 300, which, for the signal that has been input, determines a bit metric estimate value, which is an estimated probability that a particular bit is a "1". A complement bit metric estimate value, which is an estimated probability that a particular bit is a "0," is also obtained using a 1's complement circuit 302.

In a preferred embodiment of the invention, each bit metric estimate value output of the bit metric table will be a five-bit number, such that the probability can be characterized as one of 32 different values. Each bit metric value and corresponding complement bit metric value is then operated upon using the corresponding resulting bin weight value that has been established. Accordingly, the bit metric values are modified by combiners 304 and 306 using the weight value, also referred to as being soft-punctured, preferably by shifting the bit metric values by an amount determined by the weight value. Thus, in subsequent branch metric calculations, the weights used by the Viterbi decoder 226 take into account both the channel and other a-priori characteristics that allow differentiation between good and bad bits.

Within the Viterbi decoder 226, the bit metric values, or decision metrics, are used in determining how to proceed to the next state of the trellis, with each of the decision metrics being modified by the puncturing that has occurred. Thus, if hard puncturing has occurred, thereby giving no weight to the punctured bit, each state in the trellis will simply select the previous possible state with the lowest state metric and maintain that metric. If soft puncturing has occurred, thereby giving some weight to the punctured bit, each state in the trellis will simply select the previous possible state taking into account the weighted decision metric.

The above description thus provides a description of how to implement soft and hard puncturing in the receiver according to the present invention. The following description will now provide a further description of the manner in which the soft and hard puncturing in the receiver, according to the present invention, are useful.

Thus, as one example, puncturing can be used to avoid known jamming signals. Thus, as described above, if particular frequency bins in an OFDM based system (or other samples in a single carrier system) are thought to be erroneous, they can be punctured to be ignored completely, or weighted less to reduce the negative effects of errors while allowing some useful information to be extracted. Particular frequency bins could be erroneous due to transmitter or receiver circuit noise, jammers occupying the same frequency space from incompatible communication protocols, or devices emitting RF interference such as consumer microwave ovens.

To address frequency-hopping interference (for example, Bluetooth signals, wherein the interference appears pseudo-randomly in multiple frequency bins), one could either note which frequencies are being trampled by detecting low-SNR, or else provide just enough of the necessary jammer radio circuitry to determine the hopping sequence. For example, to mitigate 2.4 GHz Bluetooth interference in a high-rate 2.4 GHz IEEE 802.11b system, one could build enough of the Bluetooth radio and protocol stack to lock on to hopping sequences. This hopping-sequence lock would then allow a prediction of which bins to puncture (completely ignore) or weight less (partially ignore).

Another method to detect jammers or interferers in an OFDM system with channel estimates (such as required in IEEE 802.11a) is to examine the channel estimates and detect abnormally high or low carrier bins with respect to their neighboring carrier bins. For example, if three bins show a much greater channel response, particularly with a greatly different phase, it is likely that they are from a jammer. This is because there is a certain degree of smoothness anticipated in the channel response. If two carriers reveal phase differences in the two long training symbols, this too indicates that they may not be from an expected protocol-compliant signal, in which case such signals can be punctured.

Also, maximum likelihood (ML) criteria for soft puncturing may be used. The optimum weighting based on ML criteria is proportional to the inverse of the channel estimate. Therefore, for soft puncturing, we use the inverse of the channel estimate to weight the Viterbi metrics, providing a metric to quantify the reliability of received bits, which, in turn, correspond to frequency bins. In a preferred embodiment, the invention includes the ML criteria to quantify frequency bin reliability. The first step in the process is to define the likelihood function $L(X|\Theta)$. For example, for a noise process that is cyclo-stationary and Gaussian, the likelihood function at the receiver can be written as:

$$L(X \mid \Theta) = K e^{-\sum \frac{(X_i - \Theta_i)^2}{\sigma_i^2}} \qquad (1)$$

where K is a constant and i represents the frequency bin. The likelihood function shows how likely it is to receive a symbol X given that symbol $\Theta$ was transmitted, where $\sigma_i$ is proportional to the inverse of the magnitude of the channel estimate.

The log of the likelihood function, which provides an estimate of the likelihood of receiving a particular sequence where Gaussian-distributed noise is found, would be:

$$L(X \mid \Theta) = -\log(K) \sum \frac{(X_i - \Theta_i)^2}{\sigma_i^2} \qquad (2)$$

The Viterbi distance metric corresponds to the log of the likelihood function. From the above it is apparent that the distance metric should be proportional to as, where $\sigma_i$ is $\sigma_i$ function of the channel estimate. It should be noted that the argument above was based on an "equivalent noise" analysis, where it is assumed the received frequency domain data is scaled by the inverse of the channel.

The frequency domain system can therefore be written as $$Y_i = H_i X_i + N_i \qquad (3)$$

where $H_i$ is the channel at bin i. Now consider $H_i$ as the channel estimate. Scaling by the inverse of the channel estimate leads to $$\hat{Y}_i = (\hat{H}_i^{-1}) Y_i \approx X_i + (\hat{H}_i^{-1}) N_i \qquad (4)$$

where $\sigma_i^2 = |\hat{H}_i^{-1}| \sigma^2$. This shows the amount of noise enhancement in each frequency bin i, an amount proportional to the channel inverse.

Thus, according to the formulated likelihood criteria, the Viterbi distance metrics are preferably scaled by the above amount for a given SNR estimate. So for a channel H(k) where k represents the frequency bin number, $$\text{new branch metric}(k) = \text{branch metric}(k) \cdot \frac{1}{\sigma_k} \quad (5)$$

where $$\sigma_k = \frac{\max|H_k|}{H_k}.$$

For comparison to the background art, note that the known log likelihood function for a coded OFDM system with channel $H_{jk}$ (j=time, k=bin) as described in Alard et al., "A New System of Sound Broadcasting to Mobile Receivers" (1988) is $$L(Y|C) = \frac{\sum_{jk} \|Y_{jk} - H_{jk} * C_{jk}\|^2}{2\sigma_{jk}^2} \quad (6)$$

For BPSK and QPSK, the available art describes a decoding method. For higher order modulations, such as 16-QAM, 64-QAM and others, the "metric" term $$M_{jk} = \|Y_{jk} - H_{jk} * C_{jk}\|^2 \quad (7)$$

is typically separated into per-bit metrics that approximate the L2 Euclidean metric but is easier to calculate. This means that the "sample" or "symbol" metric is composed of a sum of bit metrics, e.g.

$$M_{jk} = \sum_l m[l](Y_{jk}, H_{jk}, C_{jk}) \quad (8)$$

where m is some specific per-bit metric function. In a Gray-coded 16-QAM system a particular choice of per-bit metric functions is described in "OFDM for Wireless Multimedia Communications", van Nee and Prasad (2000).

Equation 6 can also be written in the form:

$$L(Y|C) = \frac{\sum_{jk} \left\| \frac{Y_{jk}}{H_{jk}} - C_{jk} \right\|^2}{\left( \frac{2\sigma[j,k]^2}{\|H_{jk}\|^2} \right)} \quad (9)$$

where $H_{jk}$ can be replaced with an estimate $H^{jk}$. For implementation purposes, this is a more amenable form that, for example, permits the use a scale-independent lookup-table for the pre-bit metrics.

The inventive method comprises of extending the available method to:

1. Use the formulation of Equation 9.
2. Compute the numerators of Equation 8 using any type of separable, per-bit metric.
3. Apply an estimate $H^{jk}$ of the channel $H_{jk}$ to "weigh" the denominators as indicated in eqn4.

This is an extension of the BPSK and QPSK scheme described in the available art to higher order modulation configurations that have multiple bits per I and Q channel.

In an OFDM signal, stationary background noise and a stationary or slowly varying channel gives rise to a situation where $H_{jk}$ is periodic in the bin number k (same value in same bin for consecutive symbols), so $H_{jk}=H_k$. This has the same effect as n-equivalent cyclo-stationary noise $$\sigma'(k)^2 = \frac{\sigma^2}{\|H_k\|^2} \quad (10)$$

along with a flat equivalent channel model.

An additional optional feature of the inventive method and system entails using decoded/error-corrected parts of a data packet to train or improve decoder performance for the rest of the packet. Thus "decisions" about earlier parts of a packet "direct" the decoding of later parts of the packet. Used iteratively, decisions made on an initial pass direct the decoding of later passes.

Of course, an iterative implementation can lead to pitfalls. For example, an error occurring early in the packet or sequence causes false training later in the packet or sequence, thus worsening performance. This is known generally as error propagation. However, in the case of protocols such as 802.11a, if there are any errors in the packet, the entire packet is typically discarded. Thus, all post-Viterbi decisions are essentially "correct" with respect to training for later decisions. While the iterative approach can also be applied to pre-Viterbi decoder data (to reduce latency), care must be taken to avoid excessive error-propagation, since pre-Viterbi data can be incorrect yet still result in a correct packet.

Figure 15A:
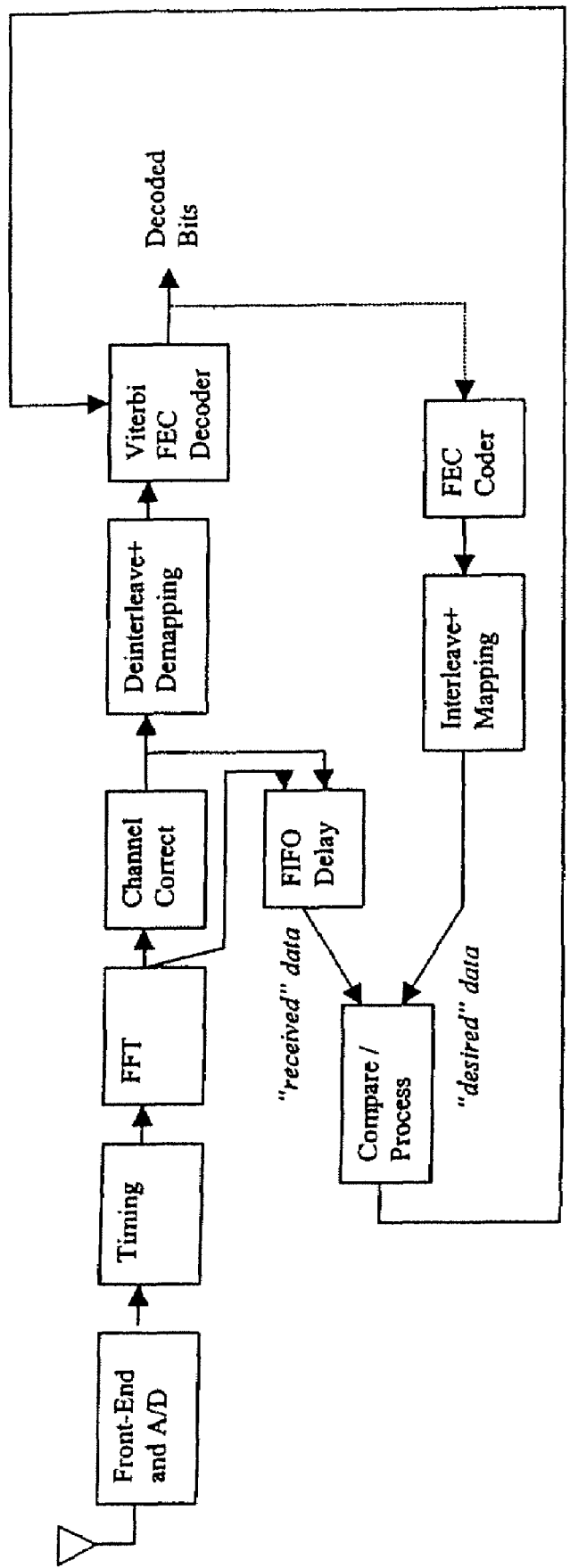
FIGS. 15A and 15B illustrate a decision directed feedback according to the present invention.

Decision directed feedback in an OFDM-based receiver, such as used in 802.11a-compliant systems, can operate by passing the output of the Viterbi decoder through the transmit chain up to but not including the IFFT. Thus, the decoded data is fed through the FEC coder, interleaver and mapper and represents the data that is expected in the receive chain after the FFT and channel correction. There will be a latency between when the data enters the receiver and when it exits the Viterbi decoder due to the processing delay of the demapping, FEC decoder, FEC encoder, and interleaver. The post-FFT receive data must be delayed similarly so that it will be available for comparison at the same time that the reconstructed data is ready. FIG. 15A illustrates the described apparatus.

Figure 15B:
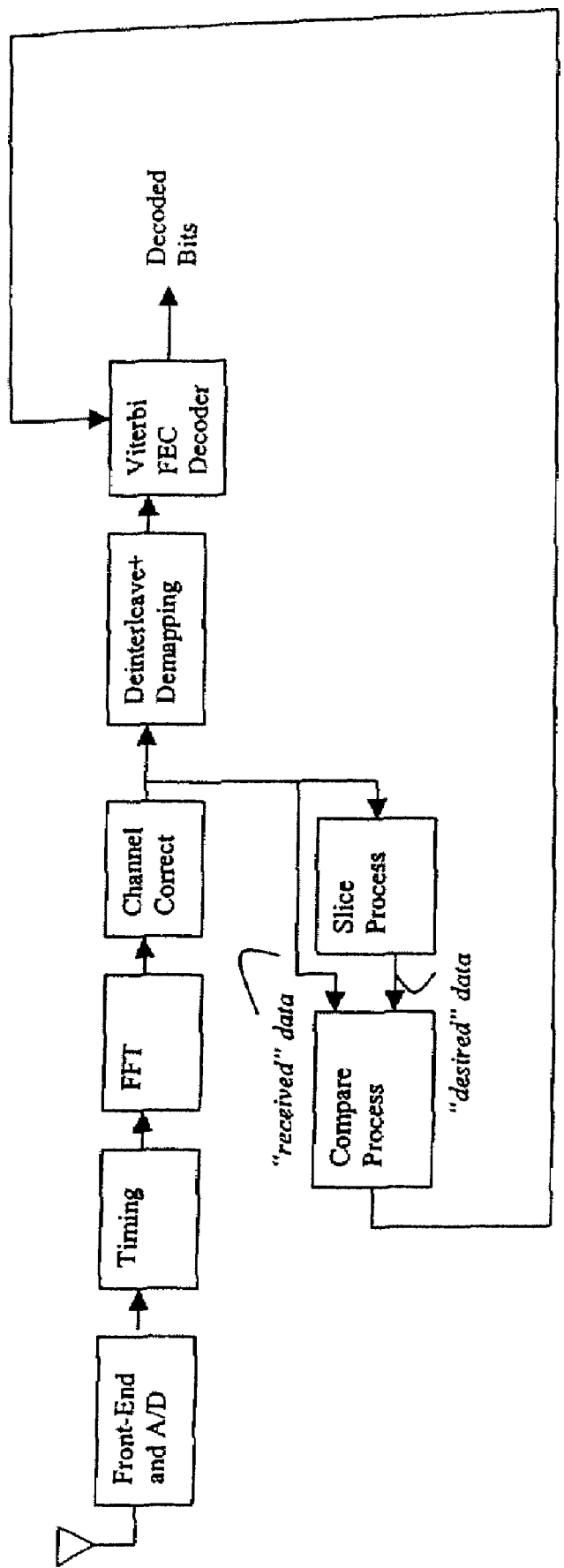

There are cases where decision feedback prior to decoding may be preferable. This may be the case if the latency of waiting for the decoding and re-encoding is harmful, such as in the case of short packets, or if the added circuitry to perform re-encoding is overly costly. In this case, if the occasional error propagation described above has a tolerable effect, decision feedback prior to decoding may provide a better solution to estimate the per-bin SNR to the Viterbi decoder weighting circuitry. FIG. 15B illustrates the described apparatus.

Once the reconstruction has been performed, a stream of received and desired frequency domain data is made available that can be used to adapt the receiver. Essentially, all of the subcarriers are made to act like pilots, as their desired and actual data is known. This is useful in determining per-bin SNR for use in selective puncturing/weighting, in which the signal-to-noise ratio per sub-carrier (or FFT bin) can be determined by computing the standard deviation of the desired frequency domain data and dividing it by the standard deviation of the difference between the desired data and the received data. The initial SNR estimate based on the channel estimate magnitude can then be adapted or replaced with the new normalized SNR estimates from the decision feedback circuitry. Selective puncturing or weighting of bins can then be executed in a manner based on the determined SNR, as described earlier. Bins with smaller SNR would be punctured or weighted less than bins with greater SNR.

The SNR estimates can be used on a per-packet basis and/or carried over between packets. This carrying over may be gated by the determined success or failure of the packet based on a checksum. Carrying over SNR estimates allows for greater averaging and is more effective acting for earlier parts of the packet, but care must be taken since two packets can come from different sources, under different channels, and at different times. Thus, some estimates from earlier packets will not be valid for later packets. Thus reuse of data between packets is most useful for receiver-specific processing, such as spurious tone estimation and long-term jamming detection and estimation. Jammer estimation may or may not vary between packets.

The present invention has been described above in connection with a preferred embodiment thereof, however, this has been done for purposes of illustration only, and the invention is not so limited. Indeed, variations of the invention will be readily apparent to those skilled in the art and also fall within the scope of the invention.

What is claimed is:

1. A method of determining a plurality of weights used for decoding a respective plurality of signals within a respective plurality of frequency bins, the method comprising the steps of:
   using a digital information decoding system,
   determining a dynamic weight for each of the respective plurality of signals within the respective plurality of frequency bins;
   determining a static weight for each of the respective plurality of signals within the respective plurality of frequency bins; and
   combining the dynamic weight and the static weight for each of the respective plurality of signals within the respective plurality of frequency bins to determine the plurality of weights, wherein the dynamic weight is based on channel estimates and the static weight is based on other than channel estimates.

2. A method according to claim 1 further including the step of applying the plurality of weights to a respective plurality of bit metrics associated with the respective plurality of signals during a Viterbi decoding process.

3. A method according to claim 2 wherein the step of determining the dynamic weight compares a channel estimate with a normalized signal value.

4. A method according to claim 2 wherein the step of determining the static weight includes the step of determining an interfering frequency caused by interfering circuit noise.

5. A method according to claim 2 wherein the step of determining the static weight includes the steps of:
   selecting an initial static weight from a predetermined static weight table for the frequency bin of interest; and
   interpolating the initial static weight based upon at least one predefined operational characteristic to obtain the static weight for the frequency bin of interest.

6. A method according to claim 5 wherein the operational characteristic is data rate.

7. A method according to claim 5 wherein the operational characteristic is amplifier gain.

8. A method according to claim 5 wherein the operational characteristic is frequency offset.

9. A method according to claim 1 wherein the step of determining the dynamic weight compares a channel estimate with a normalized signal value.

10. A method according to claim 1 wherein the step of determining the static weight includes the step of determining an interfering frequency caused by interfering circuit noise.

11. A method according to claim 1 wherein the step of determining the static weight includes the steps of:
    selecting an initial static weight from a predetermined static weight table for the frequency bin of interest; and
    interpolating the initial static weight based upon at least one predefined operational characteristic to obtain the static weight for the frequency bin of interest.

12. A method according to claim 11 wherein the operational characteristic is data rate.

13. A method according to claim 11 wherein the operational characteristic is amplifier gain.

14. A method according to claim 11 wherein the operational characteristic is frequency offset.

15. An apparatus for determining a plurality of weights used for decoding a respective plurality of signals within a respective plurality of frequency bins, the apparatus comprising:
    means for determining a dynamic weight for each of the respective plurality of signals within the respective plurality of frequency bins;
    means for determining a static weight for each of the respective plurality of signals within the respective plurality of frequency bins; and
    a combiner for combining the dynamic weight and the static weight for each of the respective plurality of signals within the respective plurality of frequency bins to determine the plurality of weights,
    wherein the dynamic weight is based on channel estimates and the static weight is based on other than channel estimates.

16. An apparatus according to claim 15 wherein the means for determining the dynamic weight includes:
    a channel estimator that provides a channel estimate for the frequency bin of interest; and
    a normalization circuit that uses the channel estimate and an estimated channel value to determine the dynamic weight.

17. An apparatus for determining a plurality of weights used for decoding a respective plurality of signals within a respective plurality of frequency bins, the apparatus comprising:
    means for determining a dynamic weight for each of the respective plurality of signals within the respective plurality of frequency bins;
    means for determining a static weight for each of the respective plurality of signals within the respective plurality of frequency bins; and
    a combiner for combining the dynamic weight and the static weight for each of the respective plurality of signals within the respective plurality of frequency bins to determine the plurality of weights,
    wherein the means for determining the static weight includes:
       a predetermined static weight table that provides, for the frequency bin of interest, an initial static weight; and
       an interpolator for interpolating the initial static weight based upon at least one predefined operational characteristic to obtain the static weight for the frequency bin of interest.

* * * * *